US012557606B2

(12) United States Patent
Yuan et al.

(10) Patent No.: US 12,557,606 B2
(45) Date of Patent: Feb. 17, 2026

(54) SEMICONDUCTOR TEST KEY INCLUDING STRIP ARRANGED RESISTOR PATTERNS

(71) Applicant: United Semiconductor (Xiamen) Co., Ltd., Fujian (CN)

(72) Inventors: Linshan Yuan, Fujian (CN); Yi Lu Dai, Shamen (CN); Guang Yang, Fujian (CN); Jinjian Ouyang, Fujian (CN); Hang Liu, Shamen (CN); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 563 days.

(21) Appl. No.: 17/699,197

(22) Filed: Mar. 21, 2022

(65) Prior Publication Data

US 2023/0260857 A1    Aug. 17, 2023

(30) Foreign Application Priority Data

Feb. 14, 2022   (CN) .......................... 202210132613.5

(51) Int. Cl.
    *H01L 21/66*    (2006.01)
    *G01R 31/28*    (2006.01)
    *H01L 23/544*   (2006.01)
    *H05K 1/02*     (2006.01)

(52) U.S. Cl.
    CPC .......... *H01L 22/34* (2013.01); *G01R 31/2884* (2013.01); *H01L 23/544* (2013.01); *H05K 1/0266* (2013.01)

(58) Field of Classification Search
    CPC ..... H01L 22/34; H01L 27/0207; H01L 28/20; H01L 23/544; H05K 1/0266; H10D 1/47; H10D 89/10; G01R 31/2884
    See application file for complete search history.

(56) References Cited

U.S. PATENT DOCUMENTS

| 6,080,597 A | * | 6/2000 | Moon | ..................... H01L 22/34 438/18 |
| 7,105,856 B1 | * | 9/2006 | Wu | ......................... H01L 22/34 257/797 |
| 8,264,235 B2 | * | 9/2012 | De Vries | ................. H01L 22/34 324/762.01 |
| 2006/0066335 A1 | * | 3/2006 | Kang | ................ G01R 31/2877 324/762.05 |

(Continued)

FOREIGN PATENT DOCUMENTS

| JP | H11126871 A | * | 5/1999 | ............. H01L 27/04 |
| JP | 2008170368 A | * | 7/2008 | ............. G01R 33/00 |
| JP | 2015023132 A | * | 2/2015 | ............. H01L 27/04 |

*Primary Examiner* — Ida M Soward
(74) *Attorney, Agent, or Firm* — Winston Hsu

(57) ABSTRACT

The invention provides a semiconductor testkey, which includes a testkey on a substrate, the testkey includes a first resistor pattern, a second resistor pattern and a third resistor pattern arranged in a strip, the distance between the first resistor pattern and the second resistor pattern is defined as a first distance, and the distance between the second resistor pattern and the third resistor pattern is defined as a second distance, the first resistor pattern, the second resistor pattern and the third resistor pattern have the same pattern, and the second distance is larger than the first distance.

9 Claims, 1 Drawing Sheet

(56) References Cited

U.S. PATENT DOCUMENTS

| | | | |
|---|---|---|---|
| 2014/0232515 A1* | 8/2014 | Harada | H01C 17/283 |
| | | | 29/610.1 |
| 2014/0240083 A1* | 8/2014 | Harada | H01C 17/006 |
| | | | 156/60 |
| 2014/0266566 A1* | 9/2014 | Gobbi | H01L 27/0802 |
| | | | 338/9 |
| 2019/0019735 A1* | 1/2019 | Lee | G01R 31/129 |
| 2019/0181063 A1* | 6/2019 | Liao | H01L 23/544 |
| 2020/0243416 A1* | 7/2020 | Chen | H01L 23/4012 |
| 2021/0405841 A1* | 12/2021 | Zheng | G06F 3/04144 |
| 2022/0077073 A1* | 3/2022 | Yoon | H01L 23/544 |
| 2022/0093477 A1* | 3/2022 | Kim | H01L 23/5228 |
| 2022/0285235 A1* | 9/2022 | Yuan | H01L 22/14 |
| 2022/0301953 A1* | 9/2022 | Kwon | H01L 23/5226 |

* cited by examiner

SEMICONDUCTOR TEST KEY INCLUDING STRIP ARRANGED RESISTOR PATTERNS

BACKGROUND OF THE INVENTION

1. Field of the Invention

The present invention relates to the field of semiconductor manufacturing process, in particular to a semiconductor test key containing a plurality of resistor patterns, wherein the distances between the resistor patterns are unequal.

2. Description of the Prior Art

Resistor is a common electronic component in the field of semiconductor manufacturing. In some practical applications, resistors are made in pairs to be used in electronic products that are also in pairs, such as headphones.

However, even if the pairs of resistors have the same or symmetrical pattern, in many steps in the semiconductor manufacturing process, some steps may affect the resistance values of the resistors, resulting in the unequal resistance values of the two sides of the pair of resistors, and affecting the quality of the subsequent electronic products (for example, the left and right sides of headphones have different sound sizes).

SUMMARY OF THE INVENTION

Therefore, it is necessary to put forward some improved methods to solve the above problems.

The invention provides a semiconductor test key, which comprises a test key on a substrate, the test key comprises a first resistor pattern, a second resistor pattern and a third resistor pattern arranged in a strip, wherein the distance between the first resistor pattern and the second resistor pattern is defined as a first distance, and the distance between the second resistor pattern and the third resistor pattern is defined as a second distance, the first resistor pattern, the second resistor pattern and the third resistor pattern have the same pattern, and the second distance is larger than the second one.

The invention also provides a method for forming a semiconductor test key, which comprises forming a test key on a substrate, wherein the test key comprises a first resistor pattern, a second resistor pattern and a third resistor pattern arranged in a strip, wherein the distance between the first resistor pattern and the second resistor pattern is defined as a first distance, and the distance between the second resistor pattern and the third resistor pattern is defined as a second distance, wherein the first resistor pattern, the second resistor pattern and the third resistor pattern have the same pattern, and the second distance is larger than the first distance.

The invention is characterize in that, because that pairs of resistor pattern actually generated in the device region may have different degrees of mis-match errors due to different distance, in order to accurately simulate whether these mis-match errors are within the allowable range, the semiconductor test key provided by the invention includes a plurality of resistor patterns, and the distances between each resistor pattern are different, so the test key of the invention can simulate the distances according to various resistances. That is, according to the distance between pairs of resistor patterns actually generated in the device region, the semiconductor test keys are used to simulate the possible mis-match errors, and the subsequent steps (such as adjusting the patterns, etc.) are carried out according to the test results. The semiconductor test key provided by the invention can be suitable for testing the resistance matching of various paired device patterns, the most suitable process parameters can be found through the test steps, the problem of resistance mis-match can be found at the front end of the process, and the problem can be corrected in time to improve the process yield and efficiency.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

One of the purposes of the present invention is to design a semiconductor test key to observe and simulate the influence of the pitch (or distance) of pair resistor on the mis-match error.

Figure 1:
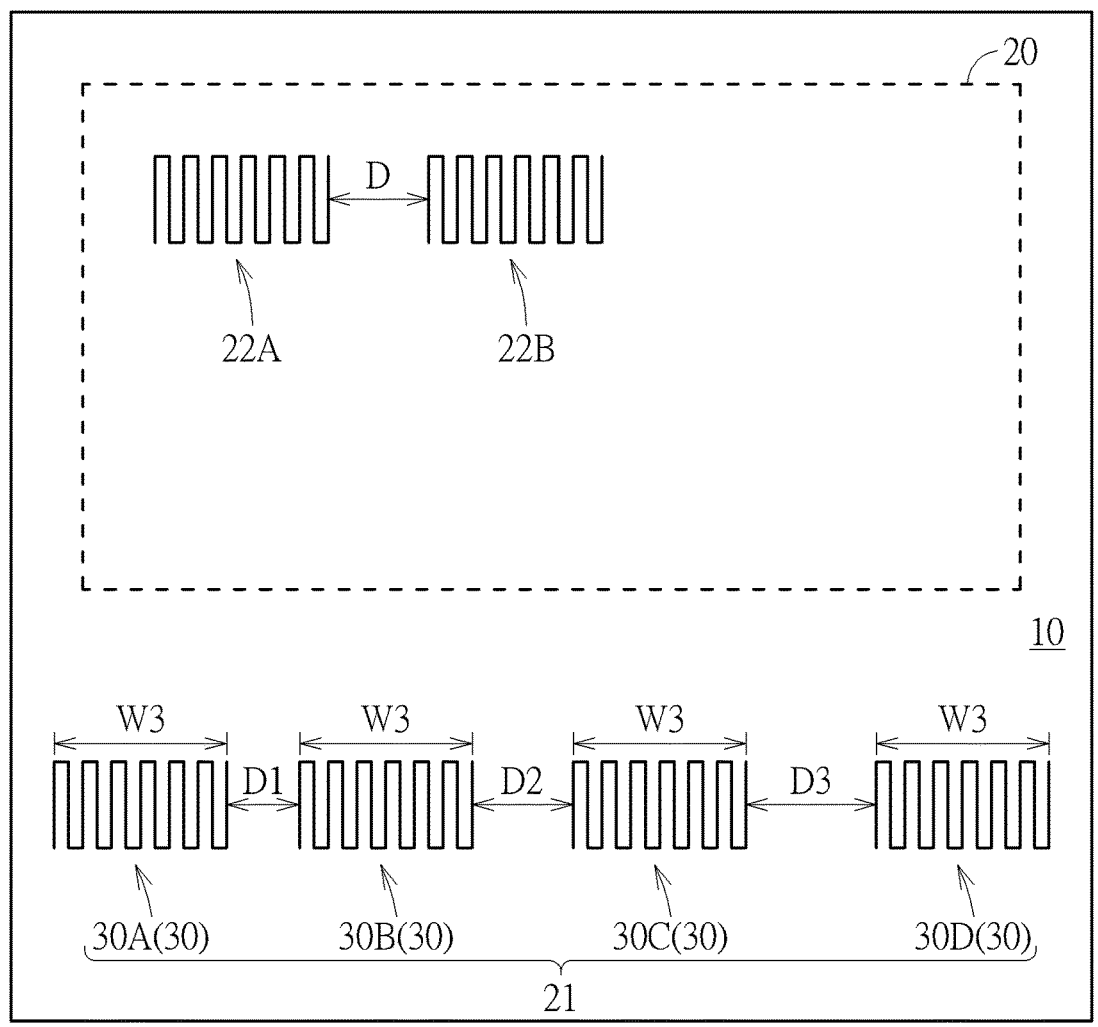
FIG. 1 shows a schematic top view of a semiconductor test key according to an embodiment of the present invention.

In order to achieve the above objectives, please refer to FIG. 1, which shows a schematic top view of a semiconductor test key provided according to an embodiment of the present invention. First, a high-density device region 20 is formed on a substrate 10, and then at least one test key 21 is included around the high-density device region 20, wherein the test key 21 includes a plurality of resistor patterns 30 arranged in a straight line. For example, the high-density device region 20 contains polysilicon patterns or doped regions, in which the density of the devices is preferably higher than 60%, and the size of the high-density device region 20 is preferably between 100 and 10,000 $\mu m^2$, but the present invention is not limited to this. Generally speaking, the high-density device region 20 is, for example, a circuit pattern region arranged beside the resistor pair in an electronic product, which may contain circuit patterns such as transistor switches and driving devices. These devices belong to the conventional technology in this field and will not be described in detail here.

Figure 2:
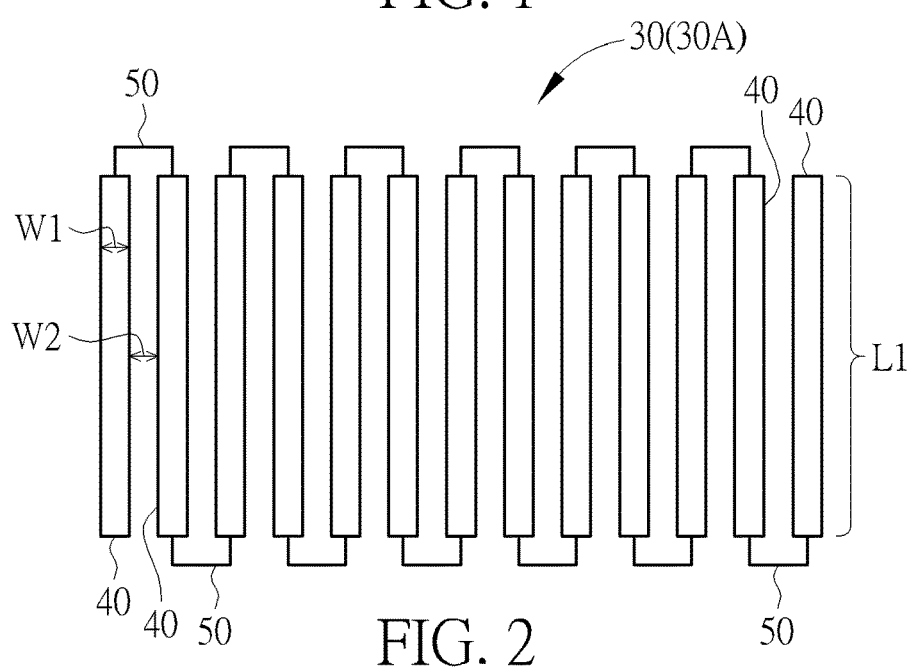
FIG. 2 shows an enlarged schematic diagram of a resistor pattern.

FIG. 2 shows an enlarged schematic diagram of a resistor pattern. As shown in FIG. 2, each resistor pattern 30 includes a plurality of parallel stripe resistor patterns 40, and a plurality of wires 50 connect the stripe resistor patterns 40 in series. According to the arrangement direction of the strip-shaped resistor patterns 40, there may be vertically arranged resistor patterns 30 or horizontally arranged resistor patterns 30. It should be noted that the present invention does not limit that the resistor pairs can only be arranged horizontally or longitudinally, and may also be arranged in other directions, which also falls within the scope of the present invention.

In addition, in this embodiment, a width W1 of each stripe resistor pattern 40 is between 0.1 μm and 1 m, a length L1 of each stripe resistor pattern 40 is between 0.5 μm and 3 m, and a distance W2 between any stripe resistor pattern 40 and another adjacent stripe resistor pattern 40 in the resistor pattern 30 is between 0.1 μm and 1 μm. However, the present invention is not limited by the above size specifications, but the size or spacing of components can be modified according to actual requirements.

Referring back to FIG. 1, in this embodiment, a plurality of resistor patterns 30 are arranged beside the high-density device region 20. It should be noted that in this embodiment, each resistor pattern 30 has the same shape, but the distances between each resistor pattern 30 are not equal to each other. For clarity, each resistor pattern 30 in FIG. 1 is defined as a first resistor pattern 30A, a second resistor pattern 30B, a third resistor pattern 30C and a fourth resistor pattern 30D, and the distance between the first resistor pattern 30A and the second resistor pattern 30B is defined as a distance D1, the distance between the second resistor pattern 30B and the third resistor pattern 30C is defined as a distance D2, and the distance between the third resistor pattern 30C and the fourth resistor pattern 30D is defined as a distance D3. In this embodiment, distance D1<distance D2<distance D3. In addition, please note that the distances D1, D2 and D3 mentioned above represent the gaps between two adjacent resistor patterns 30, that is, the distances D1, D2 and D3 do not span the range of resistor patterns 30. It can be understood that the test key 21 in FIG. 1 includes four resistor patterns (30A-30D) for simplicity of the drawing, but the present invention does not limit the number of actual resistor patterns, and only needs to include more than three resistor patterns, all of which may be included in the scope of the present invention. In addition, preferably, each resistor pattern is linearly aligned in the same direction, but the present invention does not limit its alignment direction.

It should be noted that the test key 21 is designed to simulate some devices in the high-density device region 20. Furthermore, in one of the application methods, the test key can be designed to be the same or similar to some devices in the high-density device region, and then the test key can be preferentially measured after the process is completed. In this way, a result close to that of measuring the devices in the high-density device region 20 can be obtained. If it is found that it does not meet the manufacturing requirements after measurement, it can also be repaired in time (such as adjusting process parameters, etc.). In a word, setting the test key can save the manufacturing process and improve the yield.

The applicant has found that it is sometimes necessary to produce paired device patterns in the high-density element region 20. When forming such paired device patterns, it is necessary to consider not only the forming quality of the pattern itself, it is also necessary to pay attention to whether the matching error with another corresponding pattern is within the allowable range. More specifically, taking the earphone as an example, it is shown that the resistance values of the left and right earphones should be as close as possible, so that the input power of the left and right earphones can be nearly equal. The difference ratio of the resistance values of the left and right earphones represents the mis-match error of the left and right sides of the resistor pattern. If the above-mentioned mis-match error is larger than preset allowable range, it may cause the output sounds of the left and right earphones to be inconsistent. Even if there is no problem with the quality of the resistor patterns of the left and right earphones (for example, the resistor patterns have no defects such as breakage and short circuit), it is necessary to adjust the manufacturing process to reduce the mis-match error.

In addition, the mis-match error between paired device patterns will also be affected by other factors, one of which is the distance between device patterns. Generally speaking, for the paired device patterns with a long distance, because there may be more other devices or stress structures (such as insulating layers) between the two device patterns, the mis-match error between the paired patterns will usually become larger.

That is, the conventional semiconductor test keys can only simulate the electrical quality of a single device pattern, but cannot simulate the mis-match error caused by paired device patterns. Therefore, the present invention provides an improved test key 21. The test key 21 includes a plurality of resistor patterns 30 (the first resistor pattern 30A, the second resistor pattern 30B, the third resistor pattern 30C, the fourth resistor pattern 30D, etc.), and the spacing between each resistor pattern 30 is different, so that it can be used to simulate the mis-match error between different distance device patterns. For example, the distance between the first resistor pattern 30A and the second resistor pattern 30B is D1. By measuring the resistance difference ratio between the first resistor pattern 30A and the second resistor pattern 30B (that is, the mis-match error between the first resistor pattern 30A and the second resistor pattern 30B), users can know the possible mis-match error range under the distance D1. Similarly, by measuring the resistance difference ratio between the second resistor pattern 30B and the third resistor pattern 30C, users can know the possible mis-match error range under the distance D2. Other examples are analogized.

In addition, the width of the resistor pattern 30 itself can also be calculated as the distance between two device patterns, so as to simulate more mis-match errors of different distances. For example, as shown in FIG. 1, the width of any resistor pattern 30 is W3, that is, the distance between the first resistor pattern 30A and the third resistor pattern 30C is D1+W3+D2. If the resistance difference ratio between the first resistor pattern 30A and the third resistor pattern 30C is measured, the possible mis-match error range under the distance D1+W3+D2 can be obtained. Similarly, by measuring the other two resistor patterns, users can know the mis-match error range between the two resistor patterns under the distance between the two resistor patterns. Therefore, the mis-match error of more distances can be simulated, so it is suitable for paired device patterns of different distances.

In practical application, pairs of device patterns 22A, 22B are formed in the high-density device region 20, where the distance between the device pattern 22A and the device pattern 22B is D. From the test key 21, it is possible to find out the distance segment that best accords with the distance D (for example, it may be D1, D2, D3, D1+W3+D2, D2+W3+D3, D1+W3+D2+W3+D3, etc.). Then, follow-up steps can be carried out according to the measured mis-match error range. For example, if the measured mis-match error range exceeds the allowable upper limit set by the manufacturer, it means that the manufacturer has found that there may be a large mis-match error between the device patterns in the pre-process test, and then the manufacturer can check the process steps or adjust the process parameters. On the other hand, if the measured mis-match error range is within the allowable set range, then the manufacturer can also carry out corresponding subsequent steps, such as carrying out subsequent processes or re-measuring the device patterns in the high-density device region 20 for re-confirmation. Through the above methods, it is helpful for manufacturers to find out the possible problem of excessive mis-match error in the early stage of the manufacturing process.

In addition, the resistor patterns 30 included in the test key 21 of the present invention have different distances, and the distances can be combined with each other to obtain more changes. Therefore, the test key 21 of the present invention can be suitable for simulating many different pairs of resistor patterns. It can be understood that the shape of each resistor pattern 30 can also be modified as required to conform to the shape of the actually produced device pattern 22.

Based on the above description and drawings, the present invention provides a semiconductor test key, which includes: a test key 21 on a substrate 10, wherein the test key 21 includes a first resistor pattern 30A, a second resistor pattern 30B, and a third resistor pattern 30C arranged in a strip, wherein the distance between the first resistor pattern 30A and the second resistor pattern 30B is defined as a first distance D1, The distance between the second resistor pattern 30B and the third resistor pattern 30C is defined as a second distance D2, in which the first resistor pattern 30A, the second resistor pattern 30B and the third resistor pattern 30C have the same pattern, and the second distance D2 is larger than the first distance D1.

In some embodiments of the present invention, the first resistor pattern 30A, the second resistor pattern 30B and the third resistor pattern 30C all include a plurality of strip resistor patterns 40 arranged in parallel with each other, and a plurality of wires 50 connect the strip resistor patterns 40 in series with each other.

In some embodiments of the present invention, the strip-shaped resistor pattern 40 and the wires 50 are perpendicular to each other.

In some embodiments of the present invention, a width W1 of each stripe resistor pattern 40 is between 0.1 μm and 1 μm.

In some embodiments of the present invention, a length L1 of each stripe resistor pattern 40 is between 0.5 μm and 3 μm.

In some embodiments of the present invention, in the first resistive pattern 30A, the distance W2 between any stripe resistive pattern 40 and another adjacent stripe resistive pattern 40 is between 0.1 μm and 1 μm.

In some embodiments of the present invention, a device pattern pair is further included beside the test key 21, wherein the device pattern pair includes at least two device patterns (device patterns 22A, 22B) that are symmetrical to each other.

In some embodiments of the present invention, the distance between two mutually symmetrical device patterns 22A, 22B is equal to the first distance D1 or the second distance D2.

In some embodiments of the present invention, the test key 21 further includes a fourth resistor pattern 30D located next to the third resistor pattern 30C, wherein the fourth resistor pattern 30D includes the same pattern as the third resistor pattern 30C, and the distance between the fourth resistor pattern 30D and the third resistor pattern 30C is defined as a third distance D3, wherein the third distance is greater than the second distance.

In some embodiments of the present invention, the first distance D1, the second distance D2 and the third distance D3 range from 10 μm to 1000 μm.

The invention also provides a method for forming a semiconductor test key, which comprises forming a test key 21 on a substrate 10, wherein the test key 21 comprises a first resistor pattern 30A, a second resistor pattern 30B and a third resistor pattern 30C arranged in a strip shape, wherein the distance between the first resistor pattern 30A and the second resistor pattern 30B is defined as a first distance D1, The distance between the second resistor pattern 30B and the third resistor pattern 30C is defined as a second distance D2, in which the first resistor pattern 30A, the second resistor pattern 30B and the third resistor pattern 30C have the same pattern, and the second distance D2 is larger than the first distance D1.

The invention is characterize in that, because that pairs of resistor pattern actually generated in the device region may have different degrees of mis-match errors due to different distance, in order to accurately simulate whether these mis-match errors are within the allowable range, the semiconductor test key provided by the invention includes a plurality of resistor patterns, and the distances between each resistor pattern are different, so the test key of the invention can simulate the distances according to various resistances. That is, according to the distance between pairs of resistor patterns actually generated in the device region, the semiconductor test keys are used to simulate the possible mis-match errors, and the subsequent steps (such as adjusting the patterns, etc.) are carried out according to the test results. The semiconductor test key provided by the invention can be suitable for testing the resistance matching of various paired device patterns, the most suitable process parameters can be found through the test steps, the problem of resistance mis-match can be found at the front end of the process, and the problem can be corrected in time to improve the process yield and efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor test key, comprising:
a test key located on a substrate;
wherein the test key comprises a first resistor pattern, a second resistor pattern and a third resistor pattern arranged in a strip, wherein a distance between the first resistor pattern and the second resistor pattern is defined as a first distance, and a distance between the second resistor pattern and the third resistor pattern is defined as a second distance, wherein the first resistor pattern, the second resistor pattern and the third resistor pattern have the same pattern, and the second distance is larger than the first distance, wherein the first resistor pattern, the second resistor pattern and the third resistor pattern all include a plurality of stripe resistor patterns, and a plurality of wires connect the stripe resistor patterns in series, wherein the stripe resistor patterns of the first resistor pattern, the second resistor pattern and the third resistor pattern are arranged along a same direction.

2. The semiconductor test key according to claim 1, wherein the stripe resistor pattern is perpendicular to the wires.

3. The semiconductor test key according to claim 1, wherein a width of each stripe resistor pattern is between 0.1 µm and 1 µm.

4. The semiconductor test key according to claim 1, wherein a length of each of the stripe resistor patterns is between 0.5 µm and 3 µm.

5. The semiconductor test key according to claim 1, wherein in the first resistor pattern, a distance between any strip resistor pattern and another adjacent strip resistor pattern is between 0.1 µm and 1 µm.

6. The semiconductor test key according to claim 1, wherein the first distance and the second distance are between 10 µm and 1000 µm.

7. The semiconductor test key according to claim 1, further comprising a device pattern pair located beside the test key, wherein the device pattern pair comprises two mutually symmetrical device patterns.

8. The semiconductor test key of claim 7, wherein a distance between the two mutually symmetrical device patterns is equal to the first distance or the second distance.

9. The semiconductor test key according to claim 1, wherein the test key further comprises a fourth resistor pattern disposed beside the third resistor pattern, wherein the fourth resistor pattern comprises a pattern equal to the third resistor pattern, and the distance between the fourth resistor pattern and the third resistor pattern is defined as a third distance, wherein the third distance is greater than the second distance.

\* \* \* \* \*